US012661697B2

(12) United States Patent
Nakagawa et al.

(10) Patent No.: US 12,661,697 B2
(45) Date of Patent: Jun. 23, 2026

(54) CASE AND METHOD OF USING CASE

(71) Applicant: Murata Manufacturing Co., Ltd.,
Nagaokakyo (JP)

(72) Inventors: Kiyoyuki Nakagawa, Nagaokakyo (JP);
Mitsuru Ikeda, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 29 days.

(21) Appl. No.: 18/439,797

(22) Filed: Feb. 13, 2024

(65) Prior Publication Data

US 2024/0181507 A1 Jun. 6, 2024

Related U.S. Application Data

(63) Continuation of application No.
PCT/JP2022/023321, filed on Jun. 9, 2022.

(30) Foreign Application Priority Data

Sep. 2, 2021 (JP) ................................. 2021-143052

(51) Int. Cl.
*B08B 9/46* (2006.01)
*H05K 5/02* (2006.01)
(52) U.S. Cl.
CPC ............. *B08B 9/46* (2013.01); *H05K 5/0217*
(2013.01); *B08B 2209/08* (2013.01)
(58) Field of Classification Search
None
See application file for complete search history.

(56) References Cited

U.S. PATENT DOCUMENTS 5,853,079 A 12/1998 Ito et al.

FOREIGN PATENT DOCUMENTS

| JP | 3170172 B2 | 5/2001 |
| JP | 2003040232 A | 2/2003 |
| JP | 2009295618 A | 12/2009 |
| JP | 2010135242 A | 6/2010 |

OTHER PUBLICATIONS

Google Patents translation of JP2009295618A (Year: 2025).*
International Search Report in PCT/JP2022/023321, mailed Aug.
30, 2022, 3 pages, translation filed.
Written Opinion in PCT/JP2022/023321, mailed Aug. 30, 2022, 4
pages, translation filed.
Official Communication issued in corresponding Chinese Patent
Application No. 202280046414.0, mailed on Mar. 17, 2025, 7
pages.

* cited by examiner

*Primary Examiner* — Eric W Golightly
(74) *Attorney, Agent, or Firm* — Keating & Bennett, LLP

(57) ABSTRACT

A case includes a case body including an accommodation
space to accommodate electronic components and a dis-
charge port to accommodate in and discharge the electronic
components from the accommodation space, and a shutter
slidable in the case body to open and close the discharge
port. The case body includes an inner rear wall portion
defining the accommodation space. The inner rear wall
portion includes a thin portion defining and functioning as a
through-hole formation portion at which a through hole may
be provided to allow communication between outside of the
case body and the accommodation space.

20 Claims, 12 Drawing Sheets

CASE AND METHOD OF USING CASE

CROSS REFERENCE TO RELATED APPLICATIONS

This application claims the benefit of priority to Japanese Patent Application No. 2021-143052 filed on Sep. 2, 2021 and is a Continuation Application of PCT Application No. PCT/JP2022/023321 filed on Jun. 9, 2022. The entire contents of each application are hereby incorporated herein by reference.

BACKGROUND OF THE INVENTION

1. Field of the Invention

The present invention relates to cases to accommodate electronic components, such as chip components and methods of using the cases.

2. Description of the Related Art

When mounting electronic components on a board, a mounting device is used which mounts each of the electronic components at a predetermined position on the board. It is necessary to supply electronic components individually to such a mounting device. For example, Japanese Unexamined Patent Application, Publication No. 2009-295618 discloses a case in which electronic components in a loose state are collectively housed, and the electronic components are dropped onto a feeder by their own weight from a take-out port at a bottom portion. The electronic components are individually supplied to the mounting device by the feeder.

Such a case may be reused by cleaning the inside when it becomes empty. For example, when cleaning by supplying a cleaning liquid to the inside of such a case, the cleaning liquid is supplied from an opening serving as an outlet of the electronic components. However, only one such opening is provided and is small. Therefore, is difficult to supply and discharge the cleaning liquid to and from the inside of the case smoothly.

SUMMARY OF THE INVENTION

Example embodiments of the present invention provide cases that each facilitate supplying and discharging of a cleaner, such as a cleaning liquid, to and from an inside of the case, thus enabling the inside of the case to be easily cleaned.

An example embodiment of the present invention provides a case including a case body including an accommodation space that accommodates a plurality of components and an opening to accommodate in and discharging the components from the accommodation space, and a shutter slidable in the case body and that opens and closes the opening. The case body includes a wall portion providing the accommodation space, and the wall portion includes a through-hole formation portion at which a through hole may be provided to allow communication between outside of the case body and the accommodation space.

An example embodiment of the present invention provides a method of using a case, the method including forming a through hole in a through-hole formation portion, and supplying a cleaner to an accommodation space from at least one of the through hole or an opening.

According to example embodiments of the present invention, it is possible to provide cases that each enable the inside of the case to be easily cleaned.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
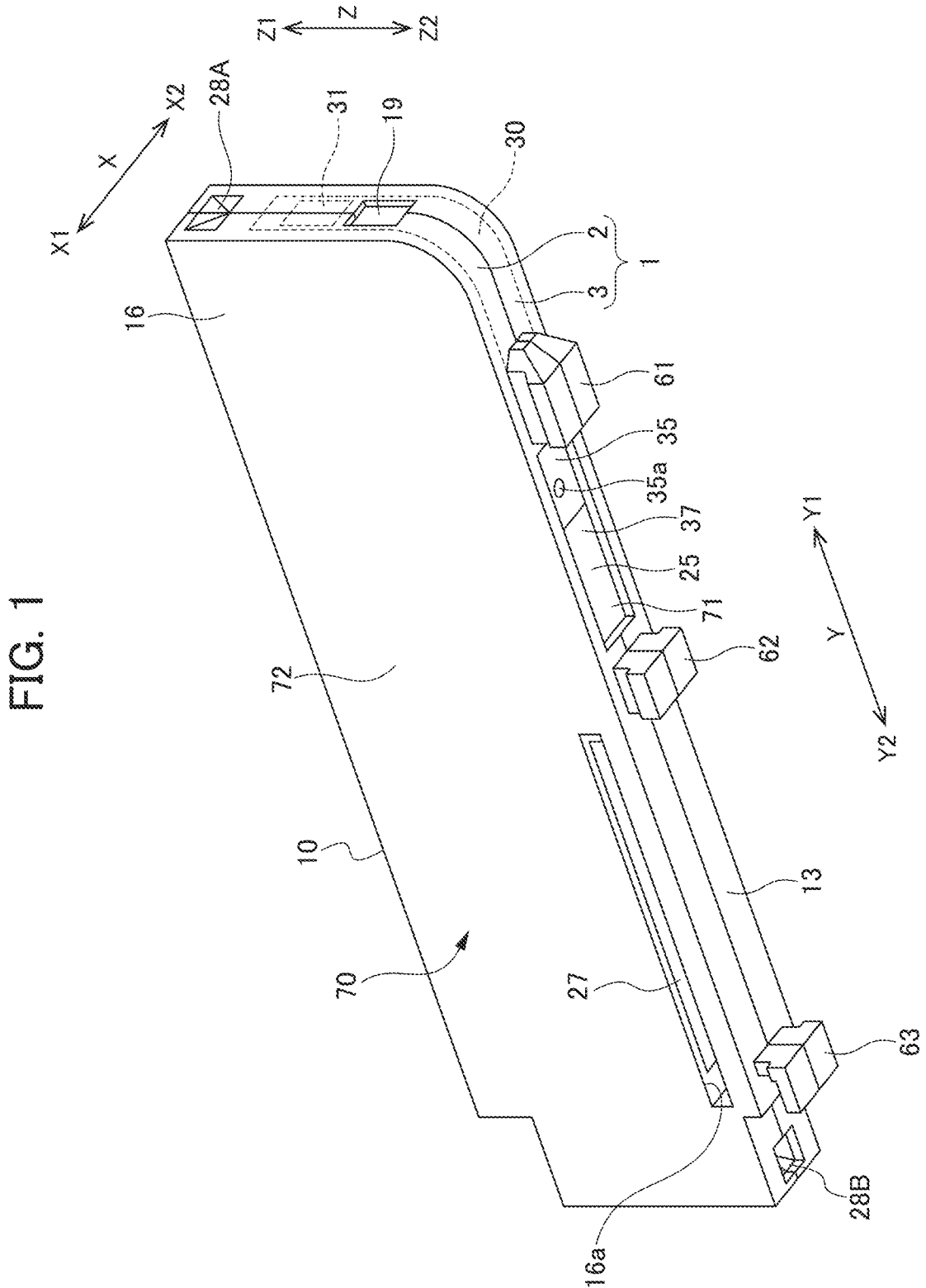
FIG. 1 is a perspective view of a case according to an example embodiment of the present invention as viewed from below.
Figure 2:
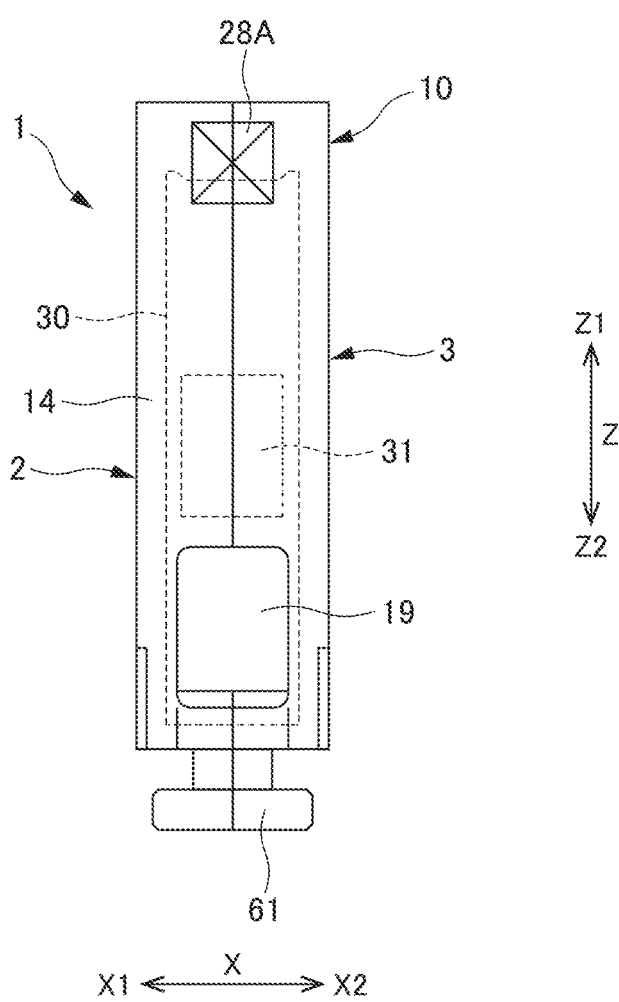
FIG. 2 is a front view of a case according to an example embodiment of the present invention.
Figure 3:
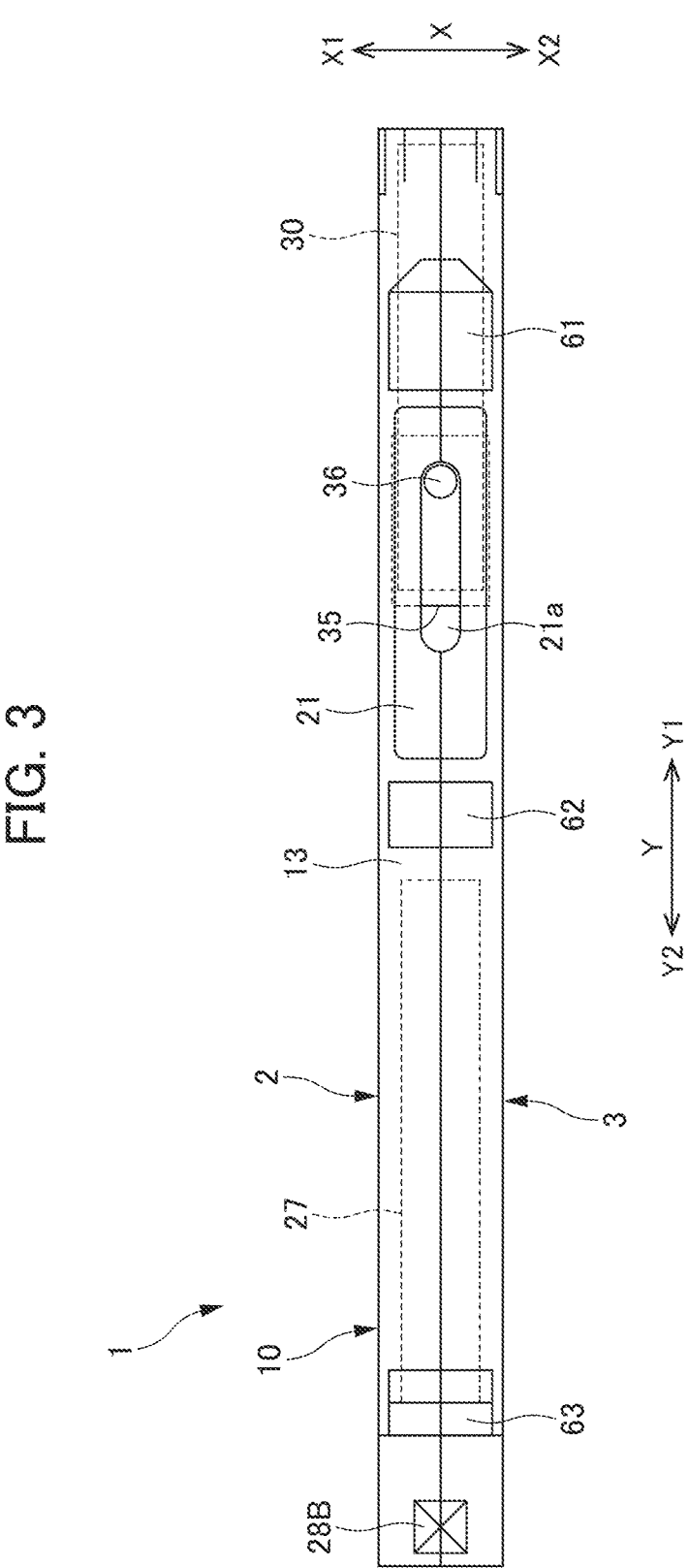
FIG. 3 is a bottom view of a case according to an example embodiment of the present invention.
Figure 4:
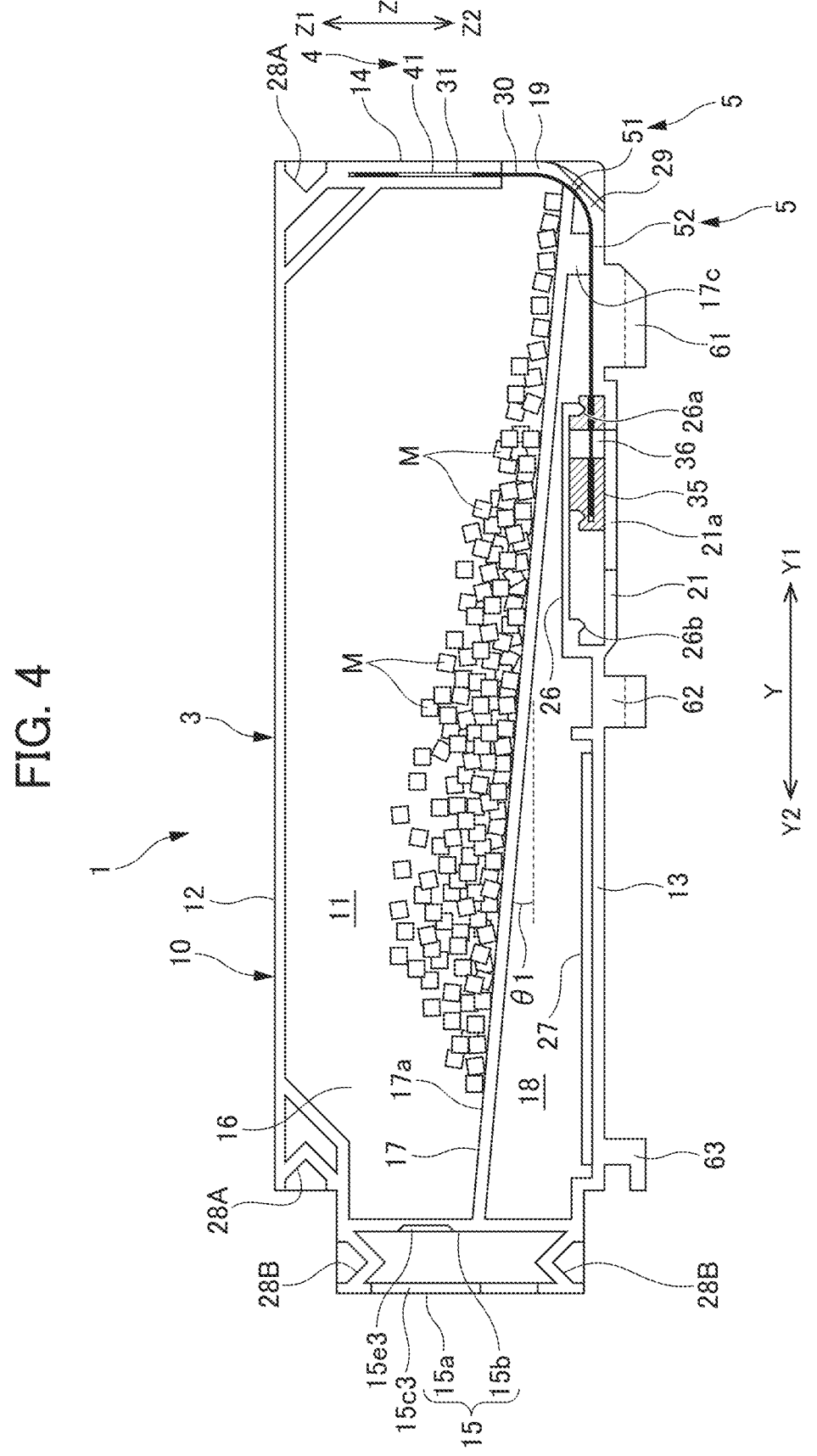
FIG. 4 is a side view of an inside of a case according to an example embodiment of the present invention.
Figure 5:
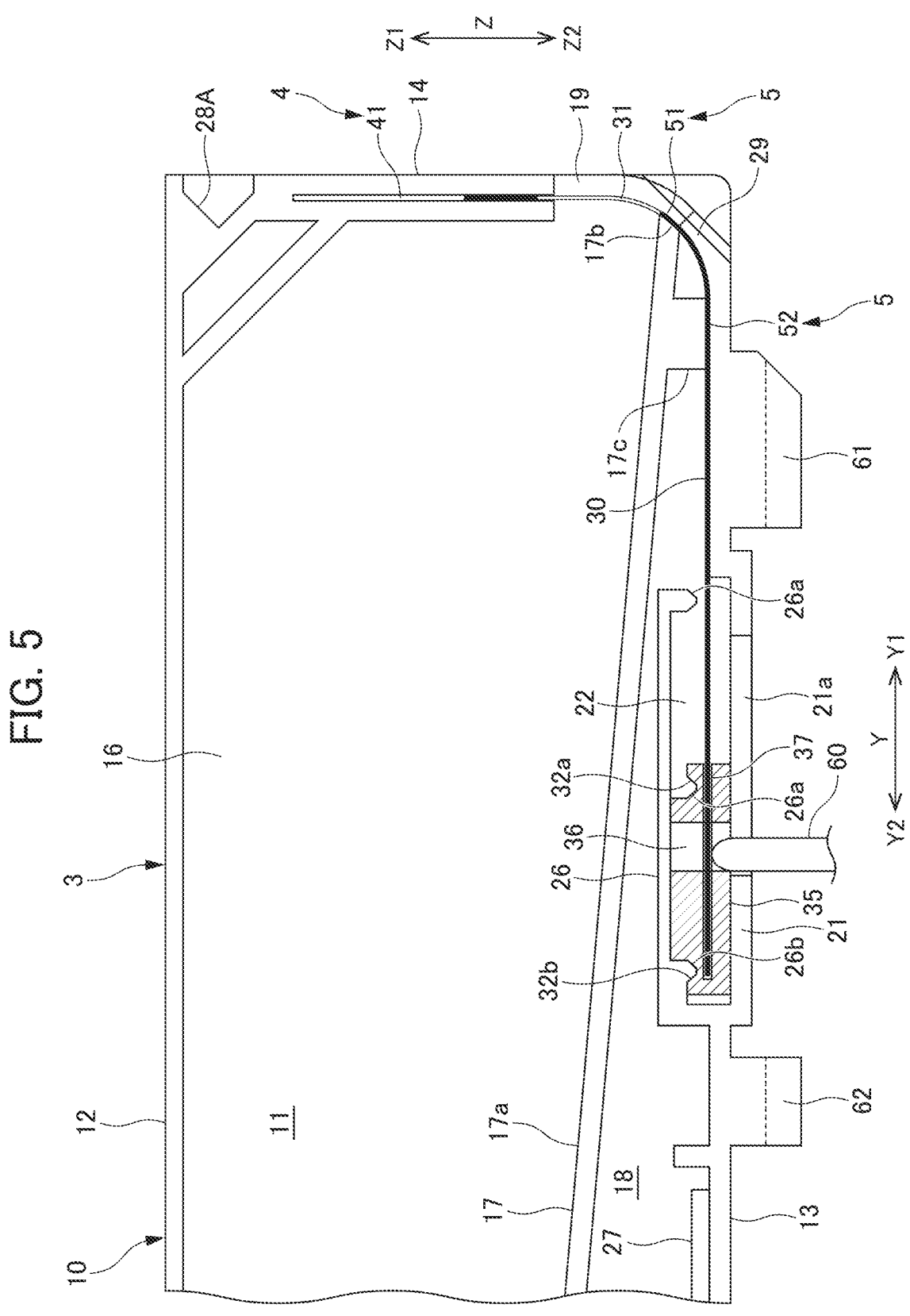
FIG. 5 is a side view of an inside of a front portion of a case according to an example embodiment of the present invention, and shows an open state in which a discharge port of the case is opened.

Example embodiments of the present invention will be described with reference to the accompanying drawings. FIG. 1 is a perspective view of a case 1 according to an example embodiment as viewed from below. FIG. 2 is a front view of the case 1. FIG. 3 is a bottom view of the case 1. FIG. 4 is a side view of the inside of the case 1. FIG. 5 is a side view of the inside of the front portion of the case 1.

As shown in FIG. 4, the case 1 accommodates therein a plurality of electronic components M in a loose state. The case 1 including the plurality of electronic components M is set in a feeder (not shown), and the electronic components M are discharged from the case 1 by vibration of the feeder and supplied to a mounting device or the like, for example. Each of the electronic components M of the present example embodiment is, for example, a minute rectangular or substantially rectangular parallelepiped electronic component with a length of about 1.2 mm or less in the longitudinal direction. Examples of such electronic components include capacitors and inductors, but the present example embodiment is not limited thereto.

Arrows X, Y, and Z in the reference drawings respectively indicate the left-right direction, the front-rear direction, and the up-down direction of the case 1 in the use state set in the feeder. Further, in the left-right direction X, the left side is denoted by X1 and the right side is denoted by X2; in the front-rear direction Y, the front side is denoted by Y1, the rear side is denoted by Y2; and in the up-down direction Z, the upper side is denoted by Z1, and the lower side is denoted by Z2. The left-right direction, the front-rear direction, and the up-down direction in the following description are based on the directions indicated by the arrows.

As shown in FIG. 1, the case 1 includes a first member 2 and a second member 3 which are divided into left and right portions. The first member 2 and the second member 3 are molded articles made of a resin such as ABS resin, for example. The first member 2 and the second member 3 are joined to each other to define the case 1. The first member 2 and the second member 3 may be joined by, for example, ultrasonic joining or joining using an adhesive, but are not limited thereto.

FIG. 4 shows a state in which the first member 2 on the left side is absent, and shows the inside of the second member 3 on the right side. The case 1 has a flat box shape that is long in the front-rear direction and thin in the left-right direction. In the following description, except where necessary, the first member 2 and the second member 3 are not individually described, and the configuration in which the first member 2 and the second member 3 are joined to each other will be described.

As shown in FIGS. 1 to 4, the case 1 includes a case body 10 that accommodates a plurality of electronic components M, a discharge port 19 that defines and functions as an opening to accommodate the electronic components M in the case 1 and to discharge the electronic components M from the case 1, a shutter 30 that opens and closes the discharge port 19, and a slider 35 that slides the shutter 30.

As shown in FIG. 4, the case body 10 includes a top plate portion 12 and a bottom plate portion 13 which extend in the front-rear direction, a front wall portion 14 and a rear wall portion 15 which extend in the up-down direction, a pair of left and right side wall portions 16, and a sloped plate portion 17 which partitions the inside of the case body 10 vertically. The rear wall portion 15 includes an outer rear wall portion 15a defined and functioning as an outer surface and an inner rear wall portion 15b in front of the outer rear wall portion. The inner rear wall portion 15b is an example of a wall portion. An accommodation space 11 to accommodate the plurality of electronic components M in a loose state is provided inside the case body 10.

The discharge port 19 is provided at the lower portion of the front wall portion 14. The discharge port 19 is a rectangular or substantially rectangular opening, for example. The discharge port 19 is not limited to a rectangular or substantially rectangular shape, and may be, for example, an opening having a circular or substantially circular shape, an elliptical or substantially elliptical shape, or the like. The discharge port 19 is opened and closed by a shutter 30 described later.

The sloped plate portion 17 extends between the left and right side wall portions 16 and extends from the inner rear wall portion 15b to the lower portion of the discharge port 19. The sloped plate portion 17 is provided below the center of the case body 10 in the vertical direction. In the case body 10, the upper side of the sloped plate portion 17 defines and functions as the accommodation space 11, and the lower side of the sloped plate portion 17 defines and functions as a lower space 18.

The sloped plate portion 17 shown in FIG. 4 is sloped at a downward gradient toward the discharge port 19, and an upper surface of the sloped plate portion 17 is a sloped surface 17a which is sloped at a downward gradient toward the discharge port 19. In the present example embodiment, the slope angle θ1 of the sloped surface 17a is, for example, about 10° with respect to the horizontal direction when the case 1 is set to the feeder. The slope angle θ1 of the sloped surface 17a is preferably, for example, about 3° or more and about 100 or less. The slope angle θ1 of the sloped surface 17a is appropriately adjusted according to, for example, a vibration condition of the feeder described later.

As shown in FIG. 4, a band-shaped RFID tag 27 elongated in the front-rear direction is provided at a rear portion of the lower space 18. The RFID tag 27 is a sticker, for example, and is attached to the upper surface of the bottom plate portion 13. The RFID tag 27 is provided in the lower space 18 through a hole 16b provided in the side wall portion 16 shown in FIG. 1 and extending in the front-rear direction. The RFID tag 27 includes a known configuration including, for example, a transmission/reception unit, a memory, an antenna, and the like. For example, a reader/writer that reads and writes information from and to the RFID tag 27 is provided in the feeder in which the case 1 is set.

The case body 10 includes upper grip portions 28A and rear grip portions 28B. The upper grip portions 28A are a pair of front and rear recesses provided at both front and rear ends of the upper side of the case body 10. The rear grip portions 28B are a pair of upper and lower recesses provided at both upper and lower ends of the rear side of the case body 10. Each of the upper grip portions 28A and the rear grip portions 28B is gripped by a robot hand, for example, when the case 1 is transported by the robot hand.

The case body 10 includes a plurality of claw portions on the bottom surface to detachably set the case body 10 in the feeder. In the present example embodiment, a first claw portion 61, a second claw portion 62, and a third claw portion 63 are provided on the bottom surface at intervals in the front-rear direction. The first claw portion 61, the second claw portion 62, and the third claw portion 63 are provided integrally with the case body 10. Each of the first claw portion 61 and the second claw portion 62 includes a T-shaped slot with an inverted T-shape in a cross section in a plane extending in the up, down, left, and right directions. The third claw portion 63 is an L-shaped plate piece extending rearward in a side view.

The shutter 30 slides to open and close the discharge port 19. The shutter 30 continuously extends from the bottom plate portion 13 to the front wall portion 14, and is slidable along the extending direction. The shutter 30 is an elongated strip-shaped film member. The shutter 30 is made of a bendable and flexible material having a certain degree of rigidity such as, for example, PET (Polyethylene terephthalate). The thickness of the shutter 30 made of such a film-shaped member is not limited, but is preferably, for example, about 0.1 mm or more and about 0.5 mm or less. The width of the shutter 30 is slightly larger than the width of the discharge port 19, and has a width capable of covering the discharge port 19 without any gap. An opening 31 having the same or substantially the same shape as the discharge port 19 is provided at the front end portion of the shutter 30.

The shutter 30 can slide along the lower guide portion 5 and the upper guide portion 4 of the case body 10. The lower guide portion 5 is provided above the bottom plate portion 13, and the upper guide portion 4 is provided above the discharge port 19. The rear side of the shutter 30 slides horizontally or substantially horizontally along the lower guide portion 5, and the front side of the shutter 30 slides vertically along the upper guide portion 4. Each of the lower guide portion 5 and the upper guide portion 4 provides a passage to slidably hold the shutter 30 while maintaining the surface direction of the shutter 30 along the lateral direction.

As shown in FIGS. 4 and 5, the lower guide portion 5 includes a first lower guide portion 51 provided below the discharge port 19 and a second lower guide portion 52 provided behind the first lower guide portion 51. The second lower guide portion 52 is provided by a gap provided between the protruding portion 17c that projects downward at the front end portion of the sloped plate portion 17 and the bottom plate portion 13. The first lower guide portion 51 is provided by a front end surface 17b of the sloped plate portion 17 and a front end portion 29 of the bottom plate portion 13.

The rear portion of the shutter 30 passes through the gap between the protruding portion 17c and the bottom plate portion 13 in the second lower guide portion 52. With such a configuration, the rear portion of the shutter 30 slides in the front-rear direction immediately above the bottom plate portion 13. In the first lower guide portion 51, the shutter 30 slides along the front end portion 29 of the bottom plate portion 13 which curves in a recessed configuration in the front-rear direction, and further slides along the front end surface 17b of the sloped plate portion 17, such that the shutter 30 bends upward at an angle of approximately 90° from the horizontal direction, and turns into a posture extending in the up-down direction.

As shown in FIGS. 4 and 5, the upper guide portion 4 includes a guide slit 41 provided in the front wall portion 14 and extending in the up-down direction. The front end portion of the shutter 30 is provided in the guide slit 41 by insertion from the lower end of the front wall portion 14, and slides in the up-down direction in the guide slit 41.

The slider 35 slides the shutter 30 to open and close the discharge port 19. As shown in FIG. 4, a slider 35 is provided at the rear end portion of the shutter 30.

As shown in FIGS. 4 and 5, the bottom plate portion 13 of the case body 10 includes a protruding plate portion 21 on the front side thereof. The protruding plate portion 21 protrudes downward and extends in the front-rear direction. The protruding plate portion 21 includes a long hole 21a extending in the front-rear direction. A plate portion 26 is provided above the protruding plate portion 21 with a predetermined space 22 therebetween. The plate portion 26 is parallel or substantially parallel to the protruding plate portion 21, and is provided integrally with the bottom plate portion 13. The space 22 is surrounded by the protruding plate portion 21, the plate portion 26, and the left and right side wall portions 16. The slider 35 is provided in the space 22. A front protruding portion 26a protruding downward is provided at a front end portion of the plate portion 26. A rear protruding portion 26b protruding downward is provided at a rear end portion of the plate portion 26.

The slider 35 is a rectangular or substantially rectangular plate piece elongated in the front-rear direction. The slider includes a circular or substantially circular operation hole 36 penetrating in the up-down direction. The operation hole 36 communicates with the long hole 21a of the case body 10, and is exposed to the outside through the long hole 21a.

As shown in FIG. 5, a slit 37 extending in the front-rear direction and opening to the front side is provided in the middle of the slider 35 in the up-down direction. The rear end portion of the shutter 30 is provided in the slit 37 by insertion from the front opening. The slit 37 opens to the front side of the slider 35, and does not open to the rear side. The slits 37 may open to the left and right sides of the slider 35. The rear end portion of the shutter 30 is provided in the slit 37 by insertion from a front end opening 37a of the slit 37. The shutter 30 is fixed to the slider 35 by, for example, adhesion. With such a configuration, the shutter 30 can slide in the space 22 integrally with the slider 35. The shutter 30 is guided by sliding by the protruding plate portion 21, the plate portion 26, and the left and right side wall portions 16 of the bottom plate portion 13, and slides in the front-rear direction.

As shown in FIG. 5, on the upper surface of the slider 35, a front recess portion 32a is provided at the front end portion, and a rear recess portion 32b is provided at the rear end portion. When the slider 35 slides forward, the front protruding portion 26a of the plate portion 26 enters the front recess portion 32a and engages therewith, and further forward sliding is restricted. At this time, the opening 31 of the shutter 30 is provided above the discharge port 19, and the discharge port 19 is closed by a portion of the shutter 30 below the opening 31.

On the other hand, when the slider 35 slides rearward, as shown in FIG. 5, the rear protruding portion 26b of the plate portion 26 enters the rear recess portion 32b and engages therewith, and further rearward sliding is restricted. At this time, the opening 31 of the shutter 30 coincides with the discharge port 19 to open the discharge port 19.

In the case 1, after a predetermined number of electronic components M are accommodated in the accommodation space 11 from the discharge port 19, the slider 35 is slid forward to close the discharge port 19 with the shutter 30, and the electronic components M are shipped to the supply destination of the electronic components. Therefore, FIG. 4 shows the inside of the case 1 at the time of shipment. The user who receives the supply of the case 1 can open the discharge port 19 as follows, for example.

As shown in FIG. 5, an operation pin 60 is inserted into the operation hole 36 of the slider 35, and the operation pin 60 is moved in the opening direction of the shutter, i.e. rearward. With such a configuration, the shutter 30 slides rearward in conjunction with the slider 35, and the opening 31 of the shutter 30 coincides with the discharge port 19 to open the discharge port 19.

The mechanism for sliding the shutter 30 to open and close the discharge port 19 is not limited to the configuration in which the slider 35 is provided integrally with the shutter 30 as described above, and other mechanisms may be used.

Figure 6A:
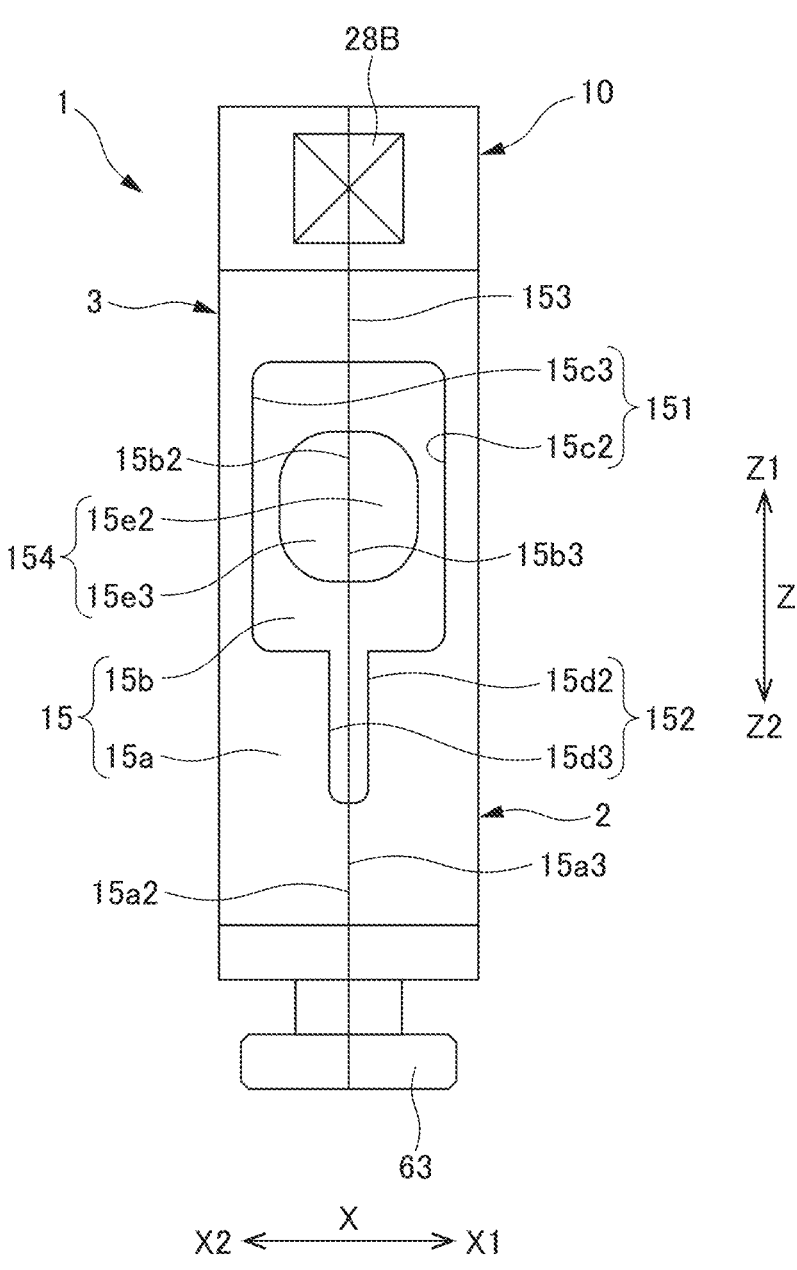
FIG. 6A is a rear view of a case according to an example embodiment of the present invention.
Figure 6B:
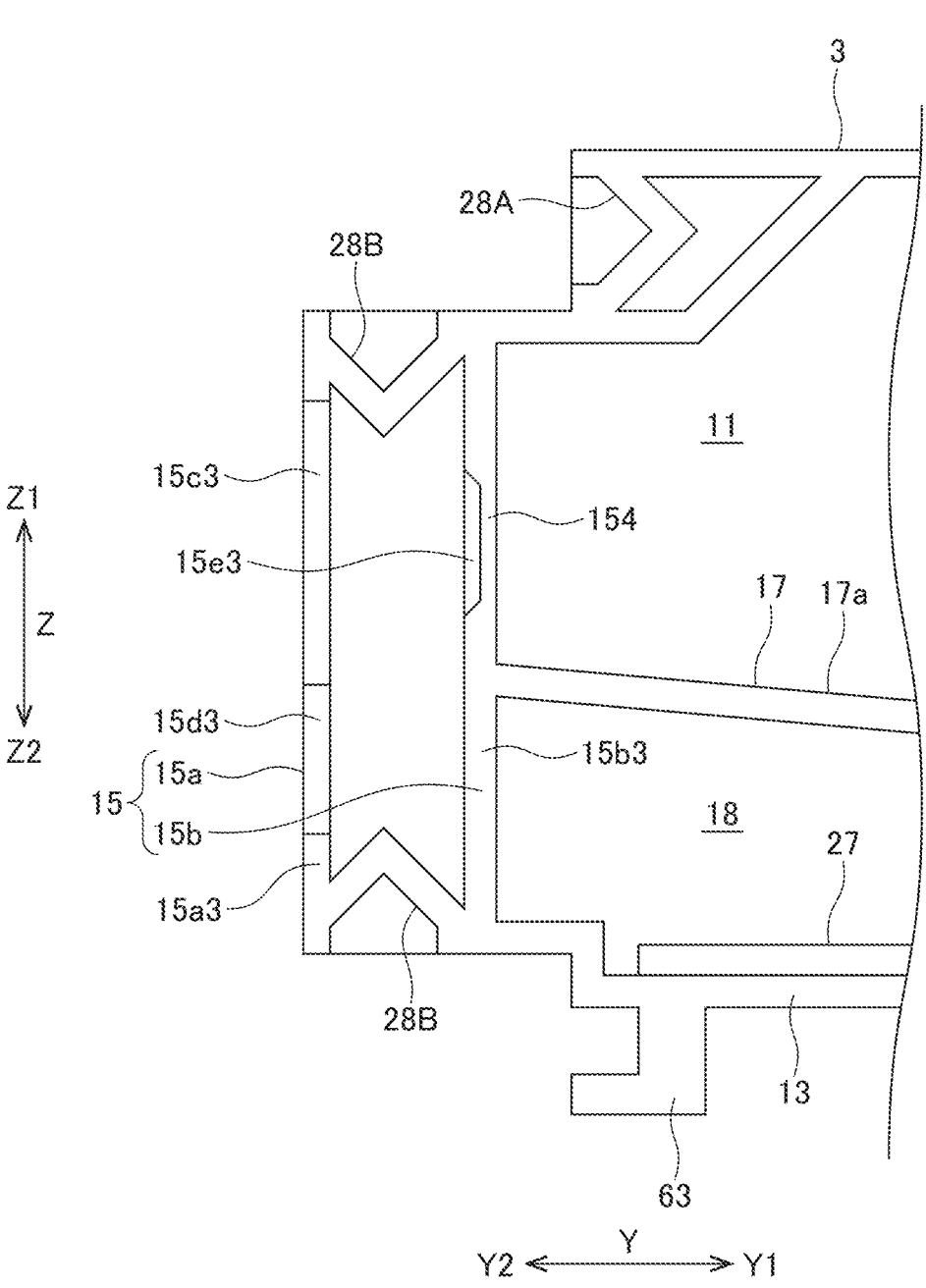
FIG. 6B is a side view of an inside of a rear end portion of a case (a second member side) according to an example embodiment of the present invention.

FIGS. 6A and 6B are diagrams each showing a rear end portion of the case 1. FIG. 6A is a rear view of the case 1 as seen from the rear wall portion 15 side. FIG. 6B is a partially enlarged side view showing the rear wall portion 15. As shown in FIGS. 6A and 6B, the first member 2 and the second member 3 defining the outer rear wall portion 15a respectively include a joining surface 15a2 and a joining surface 15a3 which are joined to each other. Further, the first member 2 and the second member 3 that provide the inner rear wall portion 15b respectively include a joining surface 15b2 and a joining surface 15b3 which are joined to each other.

The outer rear wall portion 15a includes an opening 151, which is a rectangular or substantially rectangular hole. Further, the outer rear wall portion 15a includes a gap 152 that is provided below the opening 151 and communicates with the opening 151. The opening 151 is provided by combining notches 15c2 and 15c3 provided in the joining surface 15a2 and the joining surface 15a3, respectively. The gap 152 is provided by combining notches 15d2 and 15d3 provided in the joining surface 15a2 and the joining surface 15a3, respectively. The opening 151 and the gap 152 have a symmetrical shape with respect to the boundary 153 between the joining surface 15a2 and the joining surface 15a3. The gap 152 extends in the up-down direction along the boundary 153.

Figure 7A:
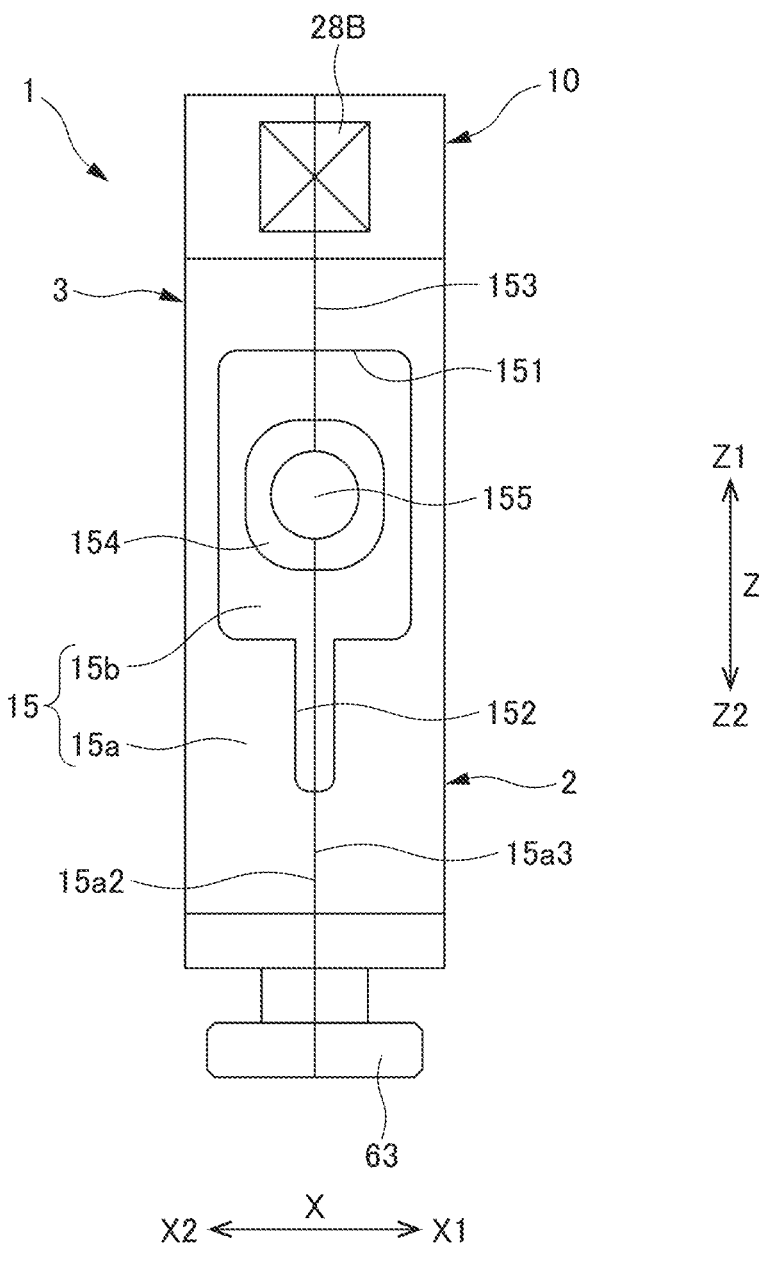
FIG. 7A is a rear view of a case according to an example embodiment of the present invention, and shows a state in which a through hole is provided in an inner rear wall portion.
Figure 7B:
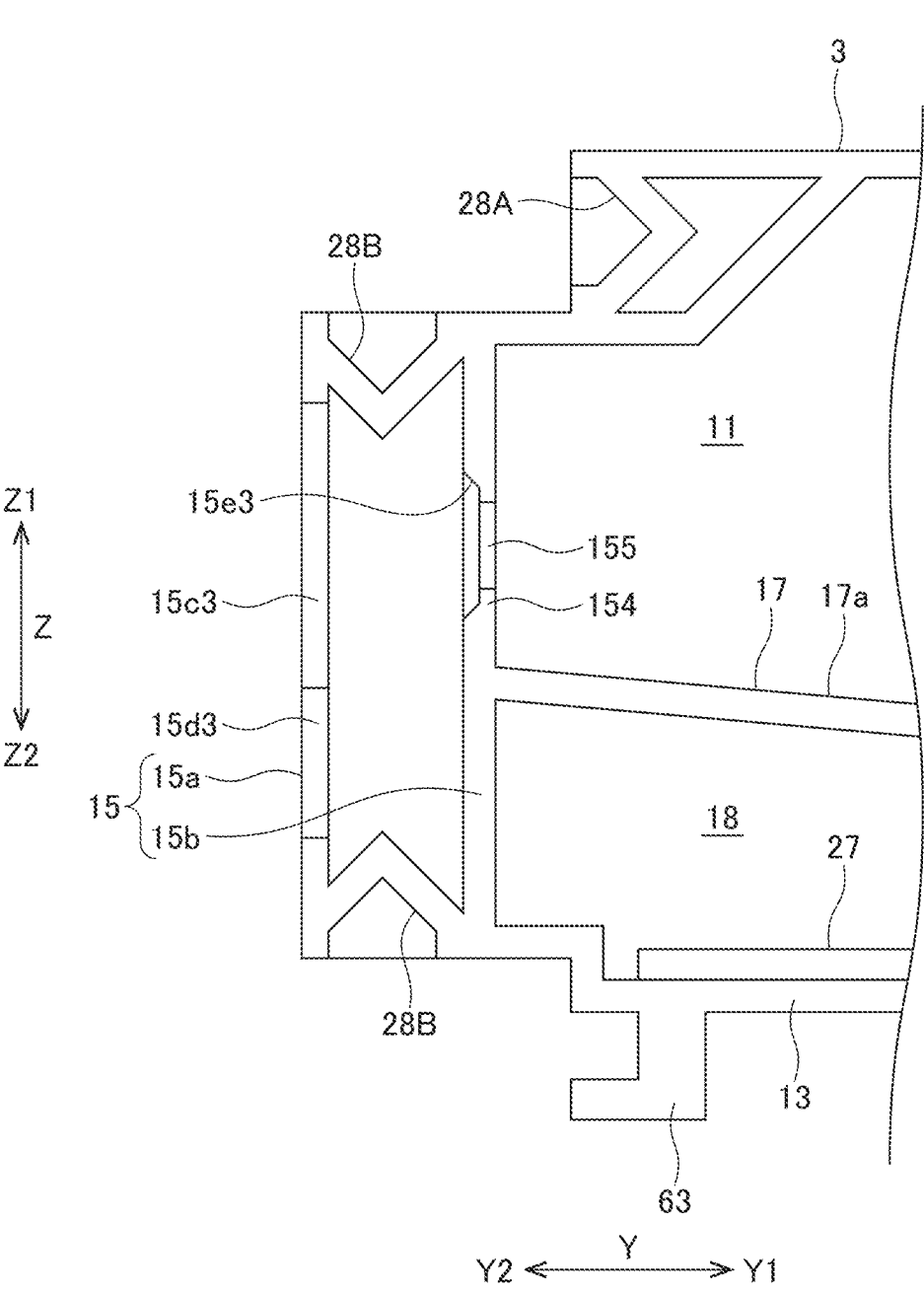
FIG. 7B is a side view of an inside of a rear end portion of a case (the second member side) according to an example embodiment of the present invention, and shows a state in which a through hole is provided in an inner rear wall portion.

A thin portion 154 defining and functioning as a through-hole formation portion is provided at a portion of the inner rear wall portion 15b which corresponds to the front of the opening 151. The thin portion 154 is obtained by reducing the thickness of the inner rear wall portion 15b, and has a shape in which each of four corners of a square is provided in an arc shape. The thin portion 154 is provided by combining a recess portion 15e2 and a recess portion 15e3 respectively provided in the first member 2 and the second member 3 defining the outer rear wall portion 15a. Each of the recess portion 15e2 and the recess portion 15e3 is provided on the rear side, i.e., adjacent to the outer rear wall portion 15a. The thin portion 154 has a symmetrical shape with the boundary 153 as a symmetrical centerline. The thickness of the thin portion 154 is, for example, about half the thickness of the inner rear wall portion 15b. When the tip of a tool such as, for example, a screwdriver having passed through the opening 151 is made to abut on the thin portion 154 and the thin portion 154 is strongly pushed toward the inner accommodation space 11, the thin portion 154 is broken, such that a through hole 155 shown in FIGS. 7A and 7B can be provided. The through hole 155 allows communication between the outside of the case 1 and the accommodation space 11.

Figure 8A:
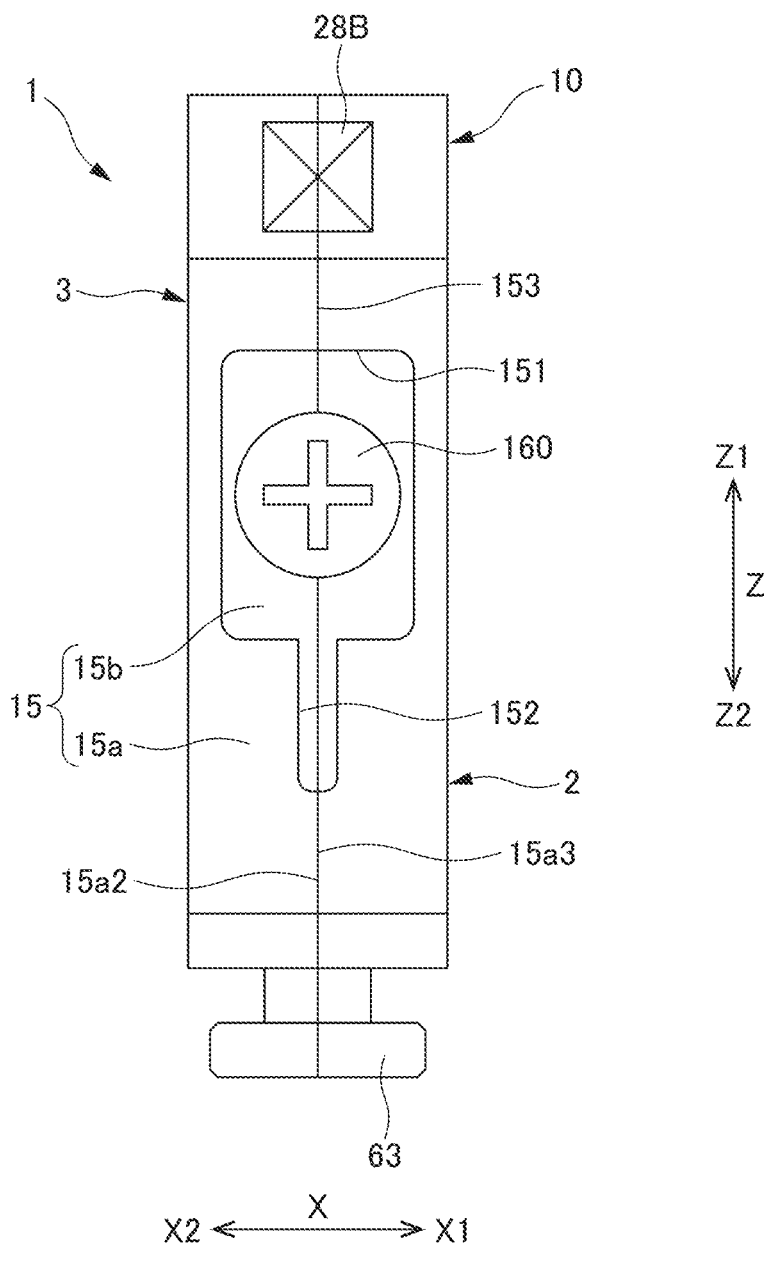
FIG. 8A is a rear view of a case according to an example embodiment of the present invention, and shows a state in which a screw is provided in a through hole of an inner rear wall portion.
Figure 8B:
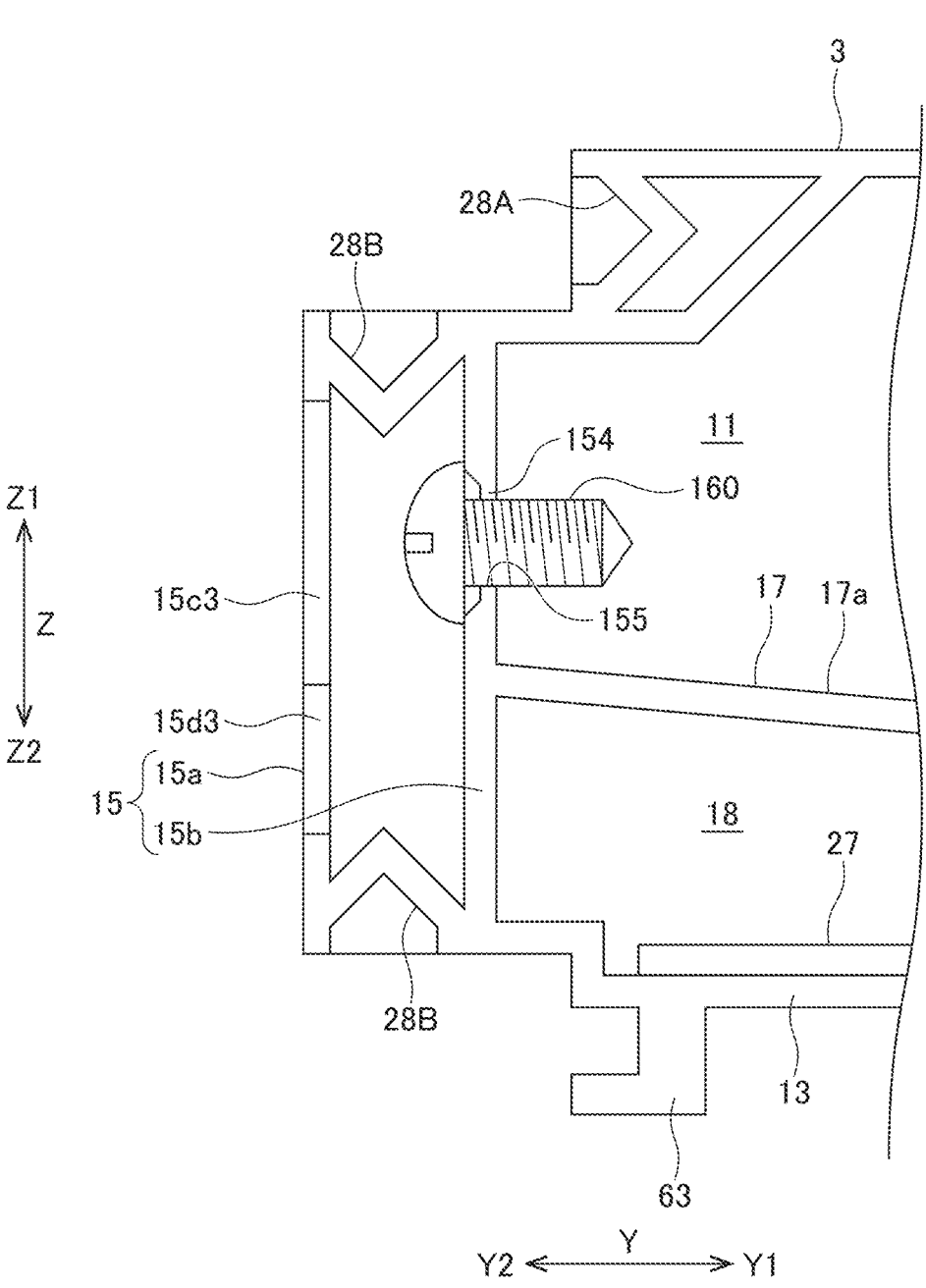
FIG. 8B is a side view of an inside of a rear end portion of a case (a second member side) according to an example embodiment of the present invention, and shows a state in which a screw is provided in a through hole of an inner rear wall portion.

As shown in FIGS. 8A and 8B, the through hole 155 provided in the thin portion 154 can be closed by a screw 160 defining and functioning as a closing member. The screw 160 is preferably detachably provided in the through hole 155. For example, as the screw 160, a tapping screw is preferably used which is tightened to the inner rear wall portion 15b using the through hole 155 as a pilot hole and which can repeatedly open and close the through hole 155 by loosening and detaching.

The case 1 according to the example embodiment described above is used, for example, as follows. In a new state in which the thin portion 154 is not destroyed, after a predetermined number of electronic components M are accommodated in the accommodation space 11 of the case body 10 from the discharge port 19 opened in advance, the discharge port 19 is closed, and the case 1 is supplied to a supply destination of the predetermined electronic component M. At the supply destination, as described above, the case 1 is set in the feeder and the discharge port 19 is opened, and the electronic components M are discharged from the discharge port 19 and supplied to a mounting device or the like by the vibration of the feeder.

The case 1 in which all of the electronic components M are discharged and emptied is returned to a supply source of the electronic components M, for example, and is used in the following manner at the supply source.

As described above, the through hole 155 is provided in the thin portion 154. When the discharge port 19 is closed, the discharge port 19 is opened, and a cleaning liquid as a cleaner is supplied from the discharge port 19 or the through hole 155 to the accommodation space 11. As the cleaning liquid, for example, an appropriate solvent that does not damage the materials of the case body 10 and the shutter 30 is used. Examples of such a solvent include a non-ionic surfactant, benzene, ketone, and alcohol, and the solvent is appropriately selected according to the material used for the case body 10. The case 1 to which the cleaning liquid is supplied to the accommodation space 11 is swung or shaken to clean the inner wall of the accommodation space 11 and the like with the cleaning liquid. At this time, the discharge port 19 and the through hole 155 are preferably closed by a structure that can be easily opened. Foreign matters such as dust, for example, present in the accommodation space 11 and fragments generated when the thin portion 154 of the inner rear wall portion 15b is broken are mixed into the cleaning liquid, such that the accommodation space 11 is cleaned. Alternatively, when the electronic components M remain in the accommodation space 11, the remaining electronic components M can be discharged together with the cleaning liquid.

Then, both of the discharge port 19 and the through hole 155 are opened, and the cleaning liquid is discharged from either one of the discharge port 19 and the through hole 155. At this time, air flows into the accommodation space 11 from the opening which is not located on the discharge side of the cleaning liquid. For example, when the cleaning liquid is discharged from the discharge port 19, air flows into the accommodation space 11 from the through hole 155. Therefore, the cleaning liquid is smoothly discharged from the case 1. The entire case 1 is dried. The cleaning in the case 1 described above may be performed using a device or may be manually performed.

After cleaning and drying the case 1, the screw 160 is threaded into the through hole 155 to close the through hole 155, thus closing the inner rear wall portion 15b. As a result, the case 1 enters the same state as in the case of a new product, and can be reused. That is, the case 1 can be supplied to the supply destination by accommodating a predetermined number of electronic components M in the accommodation space 11 from the discharge port 19 and closing the discharge port 19. Then, the case 1 which has completed the supply of the electronic components M at the supply destination can be repeatedly used by removing the screw 160 to clean the inside of the case 1, and closing the through hole 155 with the screw 160.

In order to enable reuse, the cleaner to clean the accommodation space 11 is not limited to the supply of the cleaning liquid and, for example, compressed air may be blown into the accommodation space 11 to discharge impurities such as dust, for example, to the outside of the case 1 by an air flow. The compressed air is supplied from either one of the discharge port 19 or the through hole 155 and discharged from the other. Alternatively, compressed air may be supplied to the accommodation space 11 in a drying process after washing with a cleaning liquid.

Further, in the example embodiment, it is preferable that, after cleaning the accommodation space 11 in the case 1, the accommodation space 11 is further subjected to X-ray inspection to confirm whether or not foreign matter or an electronic component M exists in the accommodation space 11 using an X-ray image or the like. In this way, it is possible to confirm the presence or absence of the adhesion of foreign matter or the presence or absence of the remaining electronic component M from an X-ray image or the like.

In the present example embodiment, when reuse is performed as described above, it is preferable to record the number of repeated uses of the case 1 in the RFID tag 27. The recording of the number of reuses in the RFID tag 27 is performed by a data writer capable of writing data in the RFID tag 27 immediately after the through hole 155 is closed by the screw 160 after cleaning or after a predetermined number of electronic components M have been loaded.

In the case 1 of the present example embodiment, the first member 2 and the second member 3 which are joined together can be partially separated from each other by inserting a tip end portion of a tool (not shown) such as a flathead screwdriver into the gap 152 of the outer rear wall portion 15a and twisting the tool or moving the tool so as to fall to either side in the left-right direction. The case 1 can be divided into the first member 2 and the second member 3 by applying a force to the first member 2 and the second member 3 so that the first member 2 and the second member 3 are separated from each other with the separated portion of the outer rear wall portion 15a as a starting point. Thus, the first member 2 and the second member 3 can be recovered for regeneration processing.

The case 1 according to the example embodiment described above includes the case body 10 including the accommodation space 11 that accommodates the plurality of electronic components M and the discharge port 19 to accommodate in and discharge the electronic components M from the accommodation space 11, and the shutter 30 that is slidable in the case body 10 and opens and closes the discharge port 19 by sliding. The case body 10 includes the inner rear wall portion 15b that provides the accommodation space 11. The inner rear wall portion 15b includes the thin portion 154 at which the through hole 155 may be provided which allows communication between the outside of the case body 10 and the accommodation space 11.

As a result, for example, when the accommodation space 11 is cleaned by the cleaning liquid for reuse as described above, the through hole 155 is provided by breaking the thin portion 154, such that the cleaning liquid can be smoothly supplied and discharged. Therefore, it is possible to easily clean the inside of the case 1.

In the case 1 according to an example embodiment, the through hole 155 provided at the thin portion 154 can be closed by the screw 160.

Thus, since the through hole 155 is closed and the inner rear wall portion 15b is restored, it is possible to reuse the case 1.

In the case 1 according to an example embodiment, it is preferable that the screw 160 defining and functioning as a closing member is detachably provided in the through hole 155.

With such a configuration, it is possible to reuse the case 1 by repeatedly using the case 1 a plurality of times.

In the case 1 according to an example embodiment, the thin portion 154 defining and functioning as the through-hole formation portion is provided in which the thickness of the inner rear wall portion 15b is reduced.

With such a configuration, it is possible to provide the through-hole formation portion capable of providing the through hole 155 with a simple configuration.

In the case 1 according to an example embodiment, it is preferable that the case body 10 includes the first member 2 and the second member 3 joined to the first member 2, and a gap 152 is provided along the boundary 153 at a portion of the boundary 153 between the joining surface 15a2 and the joining surface 15a3 of the first member 2 and the second member 3.

With such a configuration, it is possible to divide the first member 2 and the second member 3, which are joined, from each other using the gap 152 as a starting point and, for example, it is possible to recover each of the first member 2 and the second member 3 for regeneration processing.

A method of using the case 1 according to an example embodiment includes forming the through hole 155 at the thin portion 154, and supplying a cleaner to the accommodation space 11 from at least one of the through hole 155 or the discharge port 19.

This makes it possible to smoothly supply and discharge the cleaning liquid when the accommodation space 11 is cleaned, for example, with the cleaning liquid in order to reuse the case 1 as described above, such that it is possible to easily clean the inside of the case 1.

In a method of using the case 1 according to an example embodiment, the cleaner is preferably at least one of a cleaning agent or air flow.

With such a configuration, it is possible to easily remove foreign matters and the like remaining in the accommodation space 11 to the outside of the case 1, and it is possible to sufficiently clean the accommodation space 11.

In a method of using the case 1 according to an example embodiment, it is preferable to perform X-ray inspection of the accommodation space 11 after cleaning the accommodation space 11 of the case 1.

With such a configuration, it is possible to confirm whether or not foreign matter, an electronic component M, or the like exists in the accommodation space 11 of the case 1 based on an X-ray image or the like after cleaning, such that it is possible to thoroughly clean the accommodation space 11.

A method of using the case 1 according to an example embodiment preferably further includes, in a case of repeatedly using the case 1 by repeatedly accommodating the plurality of electronic components M in the accommodation space 11 and discharging the plurality of accommodated electronic components M from the discharge port 19 after cleaning the accommodation space 11 of the case 1, following which the through hole 155 formed at the inner rear wall portion 15b is closed by the screw 160, providing the RFID tag 27 to the case body 10, and recording the number of repeated uses of the case 1 in the RFID tag 27.

With such a configuration, it is possible to easily perform the management and confirmation of the number of reuses of the case 1 in the site at which handling the case 1 without performing the management and confirmation of the number of reuses of the case 1 in other places.

Although example embodiments of the present invention have been described above, the present invention is not limited to these example embodiments, and modifications, improvements, and the like within a scope of the present invention are included in the present invention.

Figure 9:
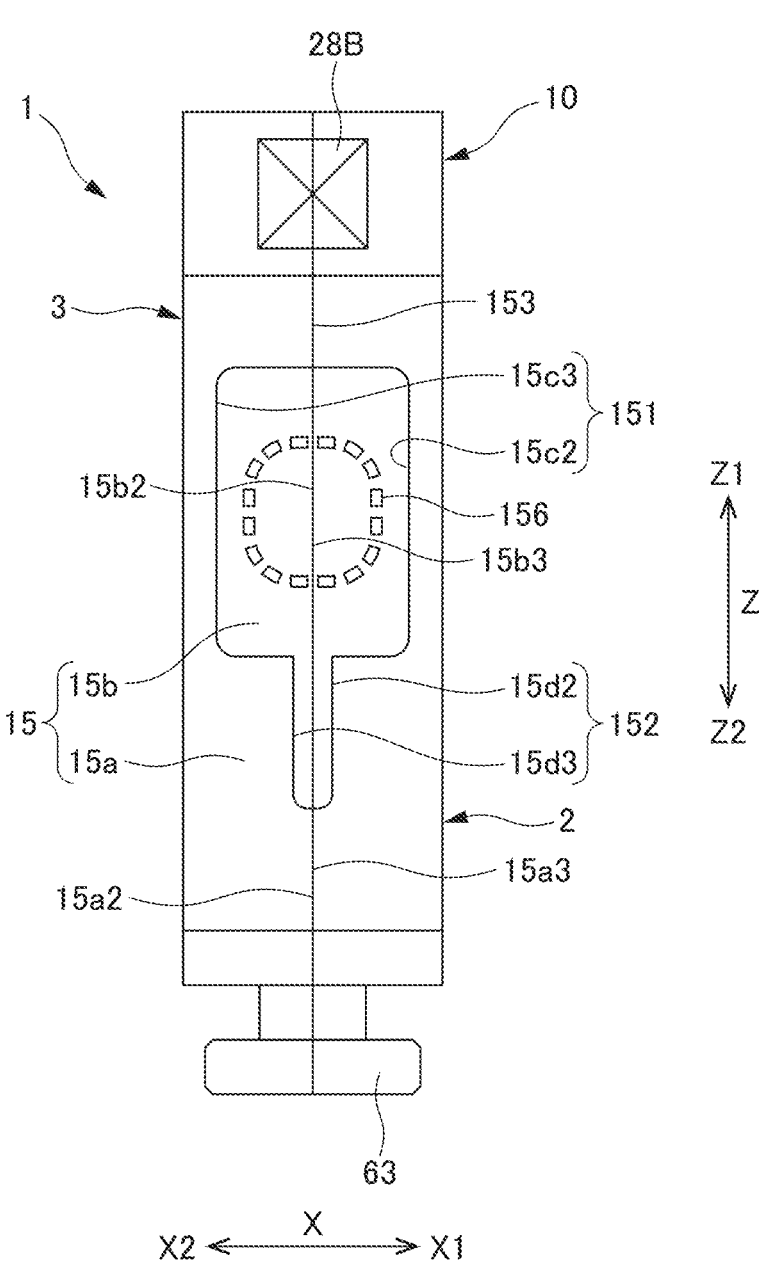
FIG. 9 is a rear view of a case according to an example embodiment of the present invention, and shows that a weak line portion is provided as a modified example of a through-hole formation portion provided in an inner rear wall portion.

For example, the through-hole formation portion is not limited to the thin portion 154. FIG. 9 shows an example in which a weak line portion 156 is included as a modified example of the through-hole formation portion. The weak line portion 156 is a portion where the strength of the inner rear wall portion 15b is weakened by a plurality of continuous small through holes 155, and is provided in a rectangular or substantially rectangular shape. The inner rear wall portion 15b can be easily broken along the weak line portion 156, and a through hole 155 the same as or similar to that of the above-described example embodiment can be provided inside the weak line portion 156.

In the above example embodiments, the case 1 is easily dividable into the first member 2 and the second member 3 by the gap 152 penetrating the outer rear wall portion 15*a*. However, a groove portion that does not penetrate the outer rear wall portion 15*a* may be provided instead of the gap 152. The closing member is not limited to the screw 160 as long as it can close the through hole 155, and may be a sticker or a cap, for example.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A case comprising:
a case body including an accommodation space to accommodate a plurality of components and an accommodation opening to accommodate in and discharge the plurality of components from the accommodation space; and
a shutter slidable in the case body to open and close the accommodation opening; wherein
the case body includes a wall portion defining the accommodation space;
the wall portion includes a through-hole formation portion at which a through hole is provided to allow communication between an outside of the case body and the accommodation space;
the case body includes a front wall portion and a rear wall portion extending in an up-down direction;
the accommodation opening is included in the front wall portion and the through-hole formation portion is included in the rear wall portion;
the front wall portion and the rear wall portion face each other in a direction that is perpendicular or substantially perpendicular to the up-down direction; and
the through-hole formation portion is provided at a portion of the rear wall portion which overlaps with a front of a rear wall opening included in the rear wall portion.

2. The case according to claim 1, further comprising:
a closer; wherein
the through hole at the through-hole formation portion is closed by the closer.

3. The case according to claim 2, wherein the closer is detachably provided in the through hole.

4. The case according to claim 1, wherein the through-hole formation portion is a thin portion of the wall portion.

5. The case according to claim 1, wherein the through-hole formation portion includes a weak line portion in the wall portion.

6. The case according to claim 1, wherein
the case body includes a first portion and a second portion joined to the first portion; and a groove portion or a gap is provided along a boundary at a portion of the boundary between joining surfaces of the first portion and the second portion.

7. A method of using the case according to claim 1, the method comprising:
forming a through hole in the through-hole formation portion; and
supplying a cleaner to the accommodation space from at least one of the through hole or the accommodation opening.

8. The method of using the case according to claim 7, wherein the cleaner includes at least one of a cleaning agent or an air flow.

9. The method of using the case according to claim 7, further comprising performing X-ray inspection of the accommodation space after cleaning the accommodation space.

10. The method of using the case according to claim 6, further comprising, when repeatedly using the case by repeatedly accommodating the plurality of components in the accommodation space and discharging the plurality of accommodated components from the accommodation opening after cleaning the accommodation space following which the through hole is closed by a closer, providing an RFID tag to the case body, and recording a number of repeated uses of the case in the RFID tag.

11. The case according to claim 1, wherein each of the plurality of components have a rectangular or substantially rectangular shape with a dimension in a longitudinal direction of about 1.2 mm or less.

12. The case according to claim 1, wherein each of the plurality of components is a capacitor or an inductor.

13. The case according to claim 6, wherein each of the first portion and the second portion is made of a resin.

14. The case according to claim 1, wherein the case body includes a top plate portion and a bottom plate portion extending in a front-rear direction, a pair of left and right side wall portions, and a slope plate portion inside the case body.

15. The case according to claim 1, wherein the case body includes a slider to slide the shutter.

16. The case according to claim 1, wherein the accommodation opening has a rectangular or substantially rectangular shape.

17. The case according to claim 14, wherein the sloped plate portion is sloped at an angle of about 10° with respect to a horizontal direction.

18. The case according to claim 14, wherein the case body includes an RFID tag attached to an upper surface of the bottom plate portion.

19. The case according to claim 18, wherein the RFID tag includes a transmitter/receiver, a memory, and an antenna.

20. The case according to claim 1, wherein the case body includes a plurality of claw portions on a bottom surface of the case body to detachably fix the case body to a feeder.

* * * * *